United States Patent
Ashimine et al.

(10) Patent No.: US 11,303,201 B2
(45) Date of Patent: Apr. 12, 2022

(54) CR SNUBBER ELEMENT

(71) Applicant: Murata Manufacturing Co., Ltd., Nagaokakyo (JP)

(72) Inventors: Tomoyuki Ashimine, Nagaokakyo (JP); Hiroshi Nakagawa, Nagaokakyo (JP); Yasuhiro Murase, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 93 days.

(21) Appl. No.: 17/023,710

(22) Filed: Sep. 17, 2020

(65) Prior Publication Data

US 2021/0006151 A1    Jan. 7, 2021

Related U.S. Application Data

(63) Continuation of application No. PCT/JP2019/015896, filed on Apr. 12, 2019.

(30) Foreign Application Priority Data

Jun. 15, 2018    (JP) .............................. JP2018-114896

(51) Int. Cl.
*H02M 1/34* (2007.01)
*H01L 27/06* (2006.01)
(Continued)

(52) U.S. Cl.
CPC .......... *H02M 1/34* (2013.01); *H01L 27/0682* (2013.01); *H01L 28/20* (2013.01); *H01L 28/90* (2013.01);
(Continued)

(58) Field of Classification Search
CPC ........ H02H 9/044; H02H 9/043; H02H 9/041; H02H 7/10; H01L 28/20; H01L 28/40;
(Continued)

(56) References Cited

U.S. PATENT DOCUMENTS 7,579,814 B2 *   8/2009   Orr ....................... H02M 3/155
                                                                323/225
8,149,555 B2     4/2012   Dorn
(Continued)

FOREIGN PATENT DOCUMENTS

JP    H01293713 A    11/1989
JP    2007306692 A   11/2007
(Continued)

OTHER PUBLICATIONS

International Search Report issued for PCT/JP2019/015896, dated Jun. 18, 2019.

(Continued)

*Primary Examiner* — Nguyen Tran
(74) *Attorney, Agent, or Firm* — ArentFox Schiff LLP (57) ABSTRACT

A CR snubber element includes a first resistance part, a first capacitance part, a second resistance part, and a second capacitance part. The first capacitance part is connected in series to the first resistance part. The second resistance part is connected in series to the first resistance part and the first capacitance part and the second capacitance part is connected in parallel to the second resistance part. The CR snubber element is configured such that the second resistance part is disconnected when the first capacitance part is short-circuited.

20 Claims, 3 Drawing Sheets

(51) Int. Cl.
H01L 49/02 (2006.01)
H02H 7/10 (2006.01)
H02H 9/04 (2006.01)

(52) U.S. Cl.
CPC .............. *H02H 7/10* (2013.01); *H02H 9/044* (2013.01); *H02M 1/348* (2021.05)

(58) Field of Classification Search
CPC ...... H01L 28/90; H01L 27/0682; H02M 1/32; H02M 1/34; H02M 1/342; H02M 1/344; H02M 1/346; H02M 1/348
See application file for complete search history.

(56) References Cited

U.S. PATENT DOCUMENTS

| | | | |
|---|---|---|---|
| 9,300,287 | B2 | 3/2016 | Kitahara |
| 2009/0262477 | A1 | 10/2009 | Dorn |
| 2013/0049654 | A1* | 2/2013 | Kure ....................... B60L 50/51 |
| | | | 318/400.2 |
| 2013/0113382 | A1 | 5/2013 | Kitahara et al. |
| 2018/0076338 | A1 | 3/2018 | Nishiwaki |
| 2021/0006062 | A1* | 1/2021 | Schlueter ......... H03K 17/08142 |

FOREIGN PATENT DOCUMENTS

| | | |
|---|---|---|
| JP | 2009225612 A | 10/2009 |
| JP | 2010503221 A | 1/2010 |
| JP | 2013098915 A | 5/2013 |
| JP | 2013207552 A | 10/2013 |
| JP | 2018046099 A | 3/2018 |

OTHER PUBLICATIONS

Written Opinion of the International Searching Authority issued for PCT/JP2019/015896, dated Jun. 18, 2019.

* cited by examiner

CR SNUBBER ELEMENT

CROSS REFERENCE TO RELATED APPLICATIONS

The present application is a continuation of PCT/JP2019/015896, filed Apr. 12, 2019, which claims priority to Japanese Patent Application No. 2018-114896, filed Jun. 15, 2018, the entire contents of each of which are incorporated herein by reference.

TECHNICAL FIELD

The present invention relates to a CR snubber element.

BACKGROUND

An existing configuration of a CR snubber circuit is discloses in Japanese Patent Application Laid-Open No. 2007-306692 ("Patent Document 1"). The CR snubber circuit disclosed in Patent Document 1 is configured by connecting a snubber capacitor and an element having a resistance component in series. The CR snubber circuit disclosed in Patent Document 1 is used in a power converter and is connected in parallel to a switching leg.

The CR snubber circuit described in Patent Document 1 is connected in parallel to a power semiconductor that configures the switching leg. As a result, a surge voltage generated during switching of the power semiconductor is absorbed by a capacitance part and consumed as heat in a resistance part, thereby suppressing the surge voltage and a ringing voltage. However, when the capacitance part of the CR snubber circuit is short-circuited, the CR snubber circuit loses the above function. Furthermore, a large current from a power supply may flow through the CR snubber circuit, which may seriously damage a circuit of an electronic component or the like disposed around the CR snubber circuit.

SUMMARY OF THE INVENTION

The exemplary embodiments of the present invention are provided in view of the above-described problems. Thus, it is an object of the present invention to provide a CR snubber element that can suppress a surge voltage and a ringing voltage, and improve reliability of a circuit when a large current flows in the CR snubber element due to a short circuit in a capacitance part of the CR snubber element.

Accordingly, a CR snubber element is provided that includes a first resistance part, a first capacitance part, a second resistance part, and a second capacitance part. The first capacitance part is connected in series to the first resistance part and the second resistance part is connected in series to the first resistance part and the first capacitance part. Moreover, the second capacitance part is connected in parallel to the second resistance part. According to the exemplary aspect, the CR snubber element is configured such that the second resistance part is disconnected when the first capacitance part is short-circuited.

In view of this embodiment, the exemplary CR snubber element is configured to suppress a surge voltage and a ringing voltage, and thereby improve reliability of a circuit when a large current flows in the CR snubber element due to a short circuit in a capacitance part of the CR snubber element.

DETAILED DESCRIPTION

Hereinafter, CR snubber elements according to the exemplary embodiments of the present invention will be described with reference to the drawings. In the following description of the embodiments, the same or corresponding parts in the drawings will be denoted by the same reference numerals and the description thereof will not be repeated.

Embodiment 1

Figure 1:
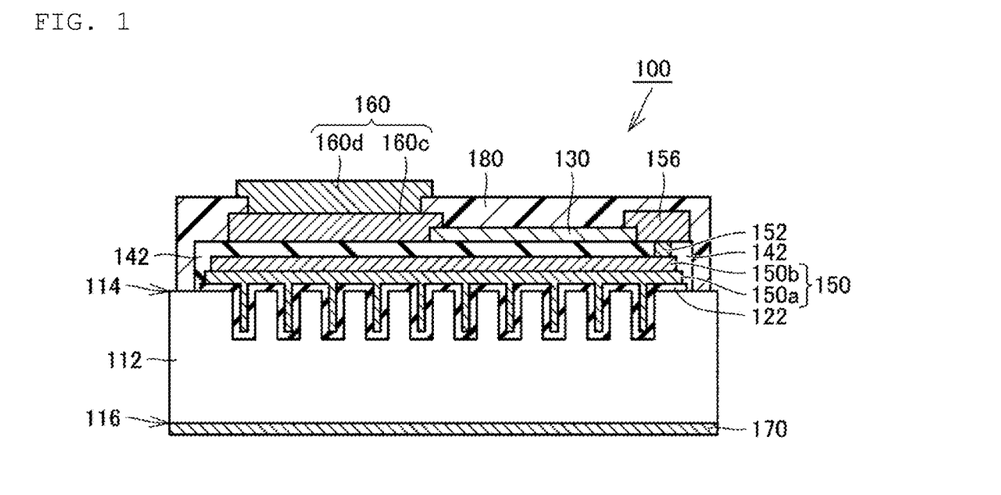
FIG. 1 is a sectional view showing a structure of a CR snubber element according to a first embodiment of the present invention.

FIG. 1 is a sectional view showing a structure of a CR snubber element according to a first embodiment of the present invention. As shown in FIG. 1, the CR snubber element 100 according to the present embodiment includes a semiconductor substrate 112, a first dielectric layer 122, an internal electrode 150, a second dielectric layer 142, and a first external electrode 160, a connection conductive part 152, and a second resistance part 130.

The semiconductor substrate 112 has a first main surface 114 and a second main surface 116 located on an opposite side of the first main surface 114. Moreover, a plurality of recesses is formed on the first main surface 114 of the semiconductor substrate 112 and extending therein.

The semiconductor substrate 112 configures a first resistance part described below. In the present embodiment, each area of the first main surface 114 and the second main surface 116 of the semiconductor substrate 112, and a thickness of the semiconductor substrate 112 are set such that a resistance value of the first resistance part is configured as described below.

In the present embodiment, the semiconductor substrate 112 is a silicon substrate doped with impurities. However, it is noted that a material of the semiconductor substrate 112 is not limited to silicon, but may be another semiconductor such as gallium arsenide. A concentration of impurities in the semiconductor substrate 112 is adjusted such that the resistance value of the first resistance part is the value described below.

The first dielectric layer 122 is located on a side of the first main surface 114 of the semiconductor substrate 112. In the present embodiment, the first dielectric layer 122 is stacked on the semiconductor substrate 112 in conformity with the plurality of recesses formed on the first main surface 114 of the semiconductor substrate 112. Further, when the CR snubber element 100 is viewed from a side of the first external electrode 160, an outer edge of the first dielectric layer 122 is located inside with respect to an outer edge of the semiconductor substrate 112.

In the present embodiment, a thickness of the first dielectric layer 122 is set such that a capacitance of the first capacitance part described below is configured as described below. Further, the first dielectric layer 122, which is stacked in conformity with the plurality of recesses formed on the first main surface 114 of the semiconductor substrate 112, increases the capacitance of the first capacitance part as compared with when the plurality of recesses is not formed on the first main surface 114. In the present embodiment, the first dielectric layer 122 is configured by $SiO_2$. However, it is noted that a material of the first dielectric layer 122 is not limited to $SiO_2$, but may be an oxide such as $Al_2O_3$, $HfO_2$, $Ta_2O_5$, $ZrO_2$, or $BaTiO_3$, or a nitride such as SiN according to alternative aspects.

As further shown, the internal electrode 150 is located on a side of the first dielectric layer 122 opposite to the semiconductor substrate 112. In the present embodiment, the internal electrode 150 is stacked on the first dielectric layer 122. When the CR snubber element 100 is viewed from the side of the first external electrode 160, an outer edge of the internal electrode 150 is located inside with respect to the outer edge of the first dielectric layer 122.

A contact area of the internal electrode 150 and the first dielectric layer 122 is set such that the capacitance of the first capacitance part is configured as described below.

In the present embodiment, the internal electrode 150 has a comb-shaped electrode part 150a and a plate-shaped electrode part 150b. The comb-shaped electrode part 150a is stacked on the first dielectric layer 122 stacked in conformity with the plurality of recesses on the first main surface 114, such that it extends into the recesses as shown.

A surface of the comb-shaped electrode part 150a opposite to a side of the first dielectric layer 122 is a flat or planar surface, and the plate-shaped electrode part 150b is stacked on the flat surface of the comb-shaped electrode part 150a.

When the CR snubber element 100 is viewed from the side of the first external electrode 160, an outer edge of the plate-shaped electrode part 150b is located inside with respect to an outer edge of the comb-shaped electrode part 150a.

According to the exemplary embodiment, it is noted that each material of the comb-shaped electrode part 150a and the plate-shaped electrode part 150b is not limited as long as the material is a conductive material. In certain aspects, the electrode parts 150a and 105b are preferably a metal such as Cu, Ag, Au, Al, Pt, Ni, Cr, or Ti, or an alloy including at least one of these metals.

Moreover, The second dielectric layer 142 is located on a side of the internal electrode 150 opposite to the first dielectric layer 122. The second dielectric layer 142 is further stacked on a multilayer body so as to cover the entire multilayer body configured by the internal electrode 150 and the first dielectric layer 122.

When the CR snubber element 100 is viewed from the side of the first external electrode 160, an outer edge of the second dielectric layer 142 is located inside with respect to the outer edge of the semiconductor substrate 112, but is located outside with respect to the outer edge of the first dielectric layer 122. Thus, in one aspect, the second dielectric layer 142 covers side surfaces of the first dielectric layer 122 as shown.

In the present embodiment, a thickness of the second dielectric layer 142 is set such that a capacitance of a second capacitance part is configured as described below. In the present embodiment, the second dielectric layer 142 is configured by $SiO_2$. However, it is noted that a material of the second dielectric layer 142 is not limited to $SiO_2$, but may be an oxide such as $Al_2O_3$, $HfO_2$, $Ta_2O_5$, or $ZrO_2$, or a nitride such as SiN.

The first external electrode 160 is located on a side of the second dielectric layer 142 opposite to the internal electrode 150. In the present embodiment, the first external electrode 160 has a counter electrode part 160c and a pad electrode part 160d. The first external electrode 160 is in contact with the second dielectric layer 142 at the counter electrode part 160c. The counter electrode part 160c has a plate-like shape, and faces the plate-shaped electrode part 150b with the second dielectric layer 142 interposed therebetween. The first external electrode 160 is exposed on a surface of the CR snubber element 100 at the pad electrode part 160d.

When the CR snubber element 100 is viewed from the side of the first external electrode 160, an outer edge of the first external electrode 160 is located inside with respect to the outer edge of the internal electrode 150, and an outer edge of the pad electrode part 160d is farther inside with respect to an outer edge of the counter electrode part 160c. In the present embodiment, a contact area of the first external electrode 160 and the second dielectric layer 142 is set such that the capacitance of the second capacitance part is configured as described below.

In general, it is noted that each material of the counter electrode part 160c and the pad electrode part 160d is not limited as long as the material is a conductive material. In one aspect, electrode parts 160c and 160d are preferably each a metal such as Cu, Ag, Au, Al, Pt, Ni, Cr, or Ti, or an alloy including at least one of these metals.

The connection conductive part 152 is disposed so as to penetrate the second dielectric layer 142. The connection conductive part 152 is disposed apart from the first external electrode 160 when the CR snubber element 100 is viewed from the side of the first external electrode 160. The connection conductive part 152 is directly connected to the internal electrode 150. In the present embodiment, the connection conductive part 152 is directly connected to the plate-shaped electrode part 150b of the internal electrode 150.

It is noted that the material of the connection conductive part 152 is not limited as long as the material is a conductive material, but is preferably a metal such as Cu, Ag, Au, Al, Pt, Ni, Cr, or Ti, or an alloy including at least one of these metals in exemplary aspects.

In the present embodiment, the CR snubber element 100 further includes a connection electrode 156. The connection electrode 156 is stacked on each of the second dielectric layer 142 and the connection conductive part 152 on a side of the connection conductive part 152 opposite to the internal electrode 150. As shown, the connection electrode 156 is directly connected to the connection conductive part 152.

In general, it is noted that a material of the connection electrode 156 is not limited as long as the material is a conductive material, but is preferably a metal such as Cu, Ag, Au, Al, Pt, Ni, Cr, or Ti, or an alloy including at least one of these metals according to exemplary aspects.

The second resistance part 130 is located on a side of the first external electrode 160 of the second dielectric layer 142. In the present embodiment, the second resistance part 130 is stacked on the second dielectric layer 142. The second resistance part 130 is connected to the first external electrode 160. In the present embodiment, the second resistance part 130 is directly connected to the counter electrode part 160c of the first external electrode 160.

The second resistance part 130 is connected to the internal electrode 150 with the connection conductive part 152 interposed therebetween. In the present embodiment, the second resistance part 130 is directly connected to the connection electrode 156, and thus is connected to the internal electrode 150 by the connection electrode 156.

In the present embodiment, the second resistance part 130 is configured by a thin film resistor stacked on the second dielectric layer 142. In an exemplary aspect, the thin film resistor can be formed by sputtering, vapor deposition, or the like. By configuring the second resistance part 130 with the thin film resistor, the second resistance part 130 can be easily disconnected when a temporary large current flows through the CR snubber element 100 as described below.

In one exemplary aspect, the thin film resistor is a resistor having a thickness of 10 μm or less.

Moreover, a thickness of the second resistance part 130 in a stacking direction and a size of the second resistance part 130 when the CR snubber element 100 is viewed from a side of the external electrode are set such that a resistance value of the second resistance part 130 is configured as described below.

In the present embodiment, the second resistance part 130 is configured by a NiCr alloy. However, a material of the second resistance part 130 is not limited to the NiCr alloy, and can preferably be configured by a metal such as Cu, Ag, Au, Al, Pt, Ni, Cr, Ta, or Ti, or an alloy including at least one of these metals. Moreover, the second resistance part 130 may be configured by TaN, for example.

In the present embodiment, the CR snubber element 100 further includes a second external electrode 170 that is stacked on the second main surface 116 of the semiconductor substrate 112. When the CR snubber element 100 is viewed from a side of the second external electrode 170, an external shape of the second external electrode 170 is substantially identical to an external shape of the semiconductor substrate 112.

Moreover, it is noted that a material of the second external electrode 170 is not limited to the NiCr alloy, but is preferably a metal such as Cu, Ag, Au, Al, Pt, Ni, Cr, or Ti, or an alloy including at least one of these metals according to exemplary aspects.

In the present embodiment, the CR snubber element 100 further includes a first protective layer 180. The first protective layer 180 is located on a side of the first main surface 114 of the semiconductor substrate 112. The first protective layer 180 is stacked such that only a peripheral edge of the first main surface 114 of the semiconductor substrate 112 and the pad electrode part 160d of the first external electrode 160 are exposed to outside of the CR snubber element 100. The first protective layer 180 is preferably configured by a resin material such as polyimide, for example.

Figure 2:
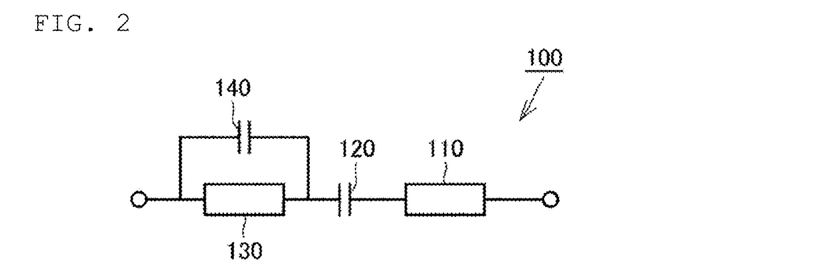
FIG. 2 is an equivalent circuit diagram of the CR snubber element of FIG. 1.

A circuit configuration and operation of the CR snubber element 100 according to the first embodiment of the present invention will be described below. FIG. 2 is an equivalent circuit diagram of the CR snubber element of FIG. 1.

As shown in FIG. 2, the CR snubber element 100 according to the first embodiment of the present invention includes a first resistance part 110, a first capacitance part 120, the second resistance part 130, and a second capacitance part 140.

The first resistance part 110 has first and second ends. The first end of the first resistance part 110 is connected to a circuit of an electronic component or the like disposed around the CR snubber element 100. A resistance value of the first resistance part 110 is, for example, 5Ω.

The first resistance part 110 is configured by the semiconductor substrate 112. As shown in FIG. 1, the second external electrode 170 is provided at end of the first and second ends of the first resistance part 110.

As shown in FIG. 2, the first capacitance part 120 is connected in series to the first resistance part 110. The first capacitance part 120 has first and second ends, with a first end of the first capacitance part 120 connected to the second end of the first resistance part 110. The capacitance of the first capacitance part 120 is, for example, 5 nF.

In the present embodiment, as shown in FIG. 1, the first capacitance part 120 is configured by the semiconductor substrate 112 facing the internal electrode 150 with the first dielectric layer 122 interposed therebetween.

As shown in FIG. 2, the second resistance part 130 is connected in series to the first resistance part 110 and the first capacitance part 120. The second resistance part 130 has first and second ends.

In the present embodiment, a first end of the second resistance part 130 is connected to the second end of the first capacitance part 120. The second end of the second resistance part 130 is connected to a circuit disposed around the CR snubber element 100. As shown in FIG. 1, the connection electrode 156 is provided at one end of the second resistance part 130. The first external electrode 160 is provided at the other end of the second resistance part 130.

In the present embodiment, the second resistance part 130 is configured by a thin film resistor. A resistance value of the second resistance part 130 is smaller than the resistance value of the first resistance part 110.

In one exemplary aspect, the resistance value of the second resistance part 130 is, for example, 0.1Ω. A thickness of the thin film resistor configuring the second resistance part 130 is, for example, 5 μm or less. Further, the resistance value of the second resistance part 130 may be equal to or greater than the resistance value of the first resistance part 110.

A value of a fusing current of the second resistance part 130 is smaller than a value of a fusing current of the first resistance part 110. The value of the fusing current is a magnitude of a current at or over which the resistance part is melt and disconnected. That is, when a current having a value equal to or greater than the value of the fusing current flows in the resistance part, the resistance part is melt and disconnected, and thus the circuit to which the resistance part is connected is blocked.

As shown in FIG. 2, the second capacitance part 140 is connected in parallel to the second resistance part 130. The second capacitance part 140 is connected in series to each of the first resistance part 110 and the first capacitance part 120.

In the present embodiment, the capacitance of the second capacitance part 140 is substantially identical to the capacitance of the first capacitance part 120. The capacitance of the second capacitance part 140 is, for example, 5 nF. As shown in FIG. 1, the second capacitance part 140 is configured by the internal electrode 150 facing the first external electrode 160 with the second dielectric layer 142 interposed therebetween.

Moreover, the CR snubber element 100 according to the present embodiment is configured such that the second resistance part 130 is disconnected when the first capacitance part 120 is short-circuited.

The following is a description of a process from the short circuit of the first capacitance part 120 to the disconnection of the second resistance part 130 in the CR snubber element 100.

The CR snubber element 100 operates as a circuit in which the first resistance part 110, the first capacitance part 120, and the second resistance part 130 are connected in series during a normal operation. At this time, the second capacitance part 140 exhibits substantially no function. For purposes of this disclosure, it is noted that the phrase "during a normal operation" refers to when the CR snubber element 100 operates as described above.

For example, when the CR snubber element 100 is connected in parallel to a power semiconductor in a power converter, a surge voltage generated during switching of the power semiconductor is absorbed by the first capacitance part 120 in the CR snubber element 100 during the normal operation, and is consumed as heat by each of the first resistance part 110 and the second resistance part 130. As a result, the surge voltage and a ringing voltage are suppressed by the CR snubber element 100 during the normal operation.

Figure 3:
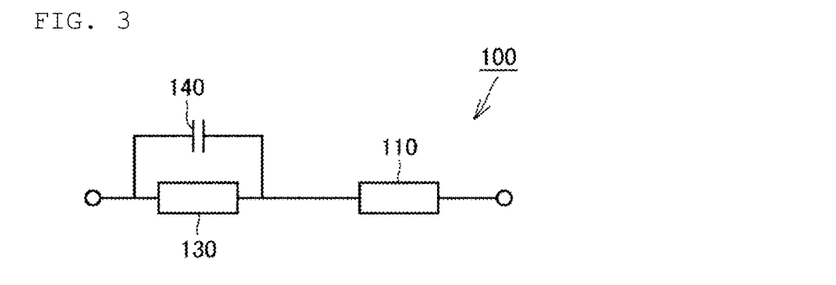
FIG. 3 is an equivalent circuit diagram showing a state where a first capacitance part of the CR snubber element of FIG. 2 is short-circuited.

FIG. 3 is an equivalent circuit diagram showing a state where the first capacitance part of the CR snubber element of FIG. 2 is short-circuited. When the first capacitance part 120 of the CR snubber element 100 is short-circuited and loses a function due to the surge voltage generated during switching of the power semiconductor as shown in FIG. 3, the CR snubber element 100 operates as a circuit in which the first resistance part 110 and the second resistance part 130 are connected in series. At this time, the second capacitance part 140 exhibits substantially no function.

In this case, a large current due to a surge voltage generated during switching of the power semiconductor temporarily flows into each of the first resistance part 110 and the second resistance part 130. The second resistance part 130 is configured to be disconnected due to this temporary large current. In the present embodiment, the second resistance part 130 is disconnected before the first resistance part 110 is disconnected because the value of the fusing current of the second resistance part 130 is smaller than the value of the fusing current of the first resistance part 110.

Figure 4:
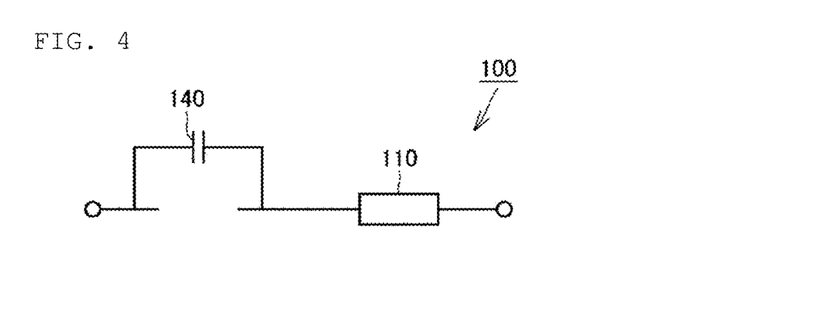
FIG. 4 is an equivalent circuit diagram showing a state where a second resistance part of the CR snubber element of FIG. 3 is disconnected.

FIG. 4 is an equivalent circuit diagram showing a state where the second resistance part of the CR snubber element of FIG. 3 is disconnected. As shown in FIG. 4, when the first capacitance part 120 of the CR snubber element 100 is short-circuited and the second resistance part 130 is disconnected, the CR snubber element 100 operates as a circuit in which the first resistance part 110 and the second capacitance part 140 are connected in series. At this time, the second capacitance part 140 substantially exhibits its function. In this way, the CR snubber element 100 in which the second capacitance part 140 substantially exhibits its function is referred to as the CR snubber element 100 after being self-repaired.

In the CR snubber element 100 after being self-repaired, the surge voltage generated during switching of the power semiconductor is absorbed by the second capacitance part 140 and is consumed as heat by the first resistance part 110. As described above, when the first capacitance part 120 is short-circuited and loses function, the second capacitance part 140 expresses the function, and the CR snubber element 100 according to the present embodiment can be self-repaired. Thus, the surge voltage and the ringing voltage can be suppressed. Further, it is possible to reduce a possibility that a circuit such as an electronic component disposed around the CR snubber element 100 in the power converter may be seriously damaged, thereby improving reliability of the circuit.

As described above, in the CR snubber element 100 according to the present embodiment, the second capacitance part 140 is connected in parallel to the second resistance part 130, and the second resistance part 130 is configured to be disconnected when the first capacitance part 120 is short-circuited. Thus, when the first capacitance part 120 of the CR snubber element 100 is short-circuited and a large current flows in the CR snubber element 100, the first resistance part 110 and the second capacitance part 140 can suppress the surge voltage and the ringing voltage and can improve the reliability of the circuit.

Further, since the second resistance part 130 is configured by the thin film resistor, the second resistance part 130 can more easily disconnected than the first resistance part 110 when a large current flows through each of the first resistance part 110 and the second resistance part 130. This can prevent the CR snubber element 100 from losing function due to the first resistance part 110 disconnected due to a temporary large current.

Further, when the first capacitance part 120 is short-circuited, the CR snubber element 100 after being self-repaired can maintain substantially the same capacitance by the second capacitance part 140 because the capacitance of the second capacitance part 140 is substantially identical to the capacitance of the first capacitance part 120.

Further, a change in the resistance value of the entire circuit of the CR snubber element 100 before and after the disconnection of the second resistance part 130 can be suppressed because the resistance value of the second resistance part 130 is smaller than the resistance value of the first resistance part 110.

Further, the second resistance part 130 is disconnected before the first resistance part 110 is disconnected because the value of the fusing current of the second resistance part 130 is smaller than the value of the fusing current of the first resistance part 110. Thus, in the CR snubber element 100, a function of the second capacitance part 140 can be exhibited.

In general, it is noted that the CR snubber element 100 according to the present embodiment, which is configured by stacking each of the first resistance part 110, the first capacitance part 120, the second resistance part 130, and the second capacitance part 140, can be compact as one small element.

It is also noted that the second external electrode 170 may be stacked on the first main surface 114 of the semiconductor substrate 112. In this case, the second external electrode 170 is stacked on a part of the first main surface 114 of the semiconductor substrate 112 where the first dielectric layer 122 is not stacked. Further, impurities may be doped only on a part in conformity with the first dielectric layer 122 on the semiconductor substrate 112 such that the first dielectric layer 122 and the second external electrode 170 stacked on the first main surface 114 are electrically connected to each other.

Embodiment 2

Figure 5:
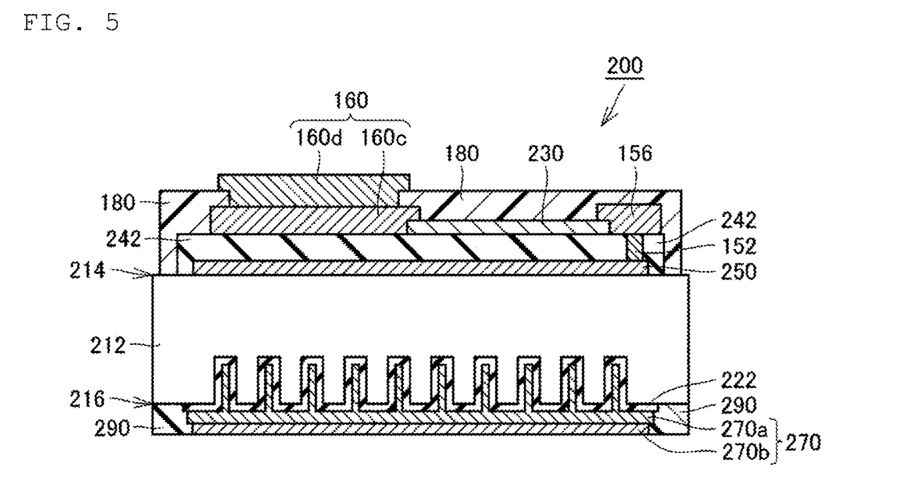
FIG. 5 is a sectional view showing a structure of a CR snubber element according to a second embodiment of the present invention.

Hereinafter, a CR snubber element according to second embodiment of the present invention will be described. The CR snubber element according to the second embodiment is mainly different from the CR snubber element 100 according to the first embodiment in that the first resistance part is disposed between the first capacitance part and the second capacitance part. Thus, the description of a configuration similar to that of the CR snubber element 100 according to the first embodiment will not be repeated.

FIG. 5 is a sectional view showing a structure of the CR snubber element according to the second embodiment of the present invention. As shown in FIG. 5, in the CR snubber element 200 according to the present embodiment, a first main surface 214 of the semiconductor substrate 212 is a flat surface, and a plurality of recesses is formed on the second main surface 216 of the semiconductor substrate 212.

A first dielectric layer 222 is located on a side of a second main surface 216 of the semiconductor substrate 212. In the present embodiment, the first dielectric layer 222 is stacked on the semiconductor substrate 212 in conformity with the plurality of recesses formed on the second main surface 216 of the semiconductor substrate 212. Further, when the CR snubber element 200 is viewed from a side of a second external electrode 270, an outer edge of the first dielectric layer 222 is located inside with respect to an outer edge of the semiconductor substrate 212.

The second external electrode 270 is located on a side of the first dielectric layer 222 opposite to the semiconductor substrate 212. In the present embodiment, the second external electrode 270 is stacked on the first dielectric layer 222. When the CR snubber element 200 is viewed from the side of the second external electrode 270, the outer edge of the second external electrode 270 is located further inside with respect to the outer edge of the first dielectric layer 222.

A contact area of the second external electrode 270 and the first dielectric layer 222 is set such that the capacitance of the first capacitance part is at the above-mentioned value. Further, the first dielectric layer 222, which is stacked in conformity with the plurality of recesses formed on the second main surface 216 of the semiconductor substrate 212, increases the capacitance of the first capacitance part as compared with when the plurality of recesses is not formed on the second main surface 216.

In the present embodiment, the second external electrode 270 has a comb-shaped electrode part 270a and a plate-shaped electrode part 270b. The comb-shaped electrode part 270a is stacked on the first dielectric layer 222 stacked in conformity with the plurality of recesses of the second main surface 216, such as to extend therein to the recesses. A surface of the comb-shaped electrode part 270a opposite to a side of the first dielectric layer 222 is a flat surface, and the plate-shaped electrode part 270b is stacked on the flat surface of the comb-shaped electrode part 270a.

When the CR snubber element 200 is viewed from the side of the second external electrode 270, an outer edge of the plate-shaped electrode part 270b is located further inside with respect to an outer edge of the comb-shaped electrode part 270a.

The internal electrode 250 is located on a side of the first main surface 214 of the semiconductor substrate 212. In the present embodiment, the internal electrode 250 is stacked on the semiconductor substrate 212. When the CR snubber element 200 is viewed from the side of the first external electrode 160, an outer edge of the internal electrode 250 is located further inside with respect to the outer edge of the semiconductor substrate 212. The internal electrode 250 is formed in a plate-like shape.

A second dielectric layer 242 is located on a side of the internal electrode 250 opposite to the semiconductor substrate 212. The second dielectric layer 242 is stacked on the internal electrode 250 and a part of the semiconductor substrate 212 so as to cover the entire internal electrode 250.

When the snubber element 200 is viewed from the side of the first external electrode 160, an outer edge of the second dielectric layer 242 is located inside with respect to the outer edge of the semiconductor substrate 212 and further outside with respect to the outer edge of the internal electrode 250.

In the present embodiment, the CR snubber element 200 further includes a second protective layer 290. The second protective layer 290 is located on a side of the second main surface 216 of the semiconductor substrate 212. The second protective layer 290 is stacked such that only the plate-shaped electrode part 270b of the second external electrode 270 is exposed to outside of the CR snubber element 200. The second protective layer 290 is preferably configured by a resin material such as polyimide.

Figure 6:
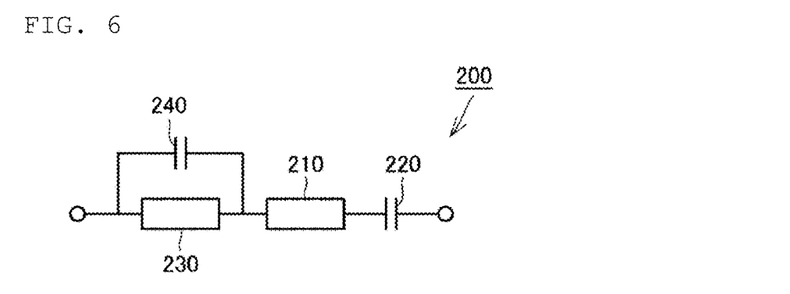
FIG. 6 is an equivalent circuit diagram of the CR snubber element of FIG. 5.

Next, a circuit configuration and operation of the CR snubber element 200 according to the second embodiment of the present invention will be described. FIG. 6 is an equivalent circuit diagram of the CR snubber element of FIG. 5. As shown in FIG. 6, in the CR snubber element 200 according to the second embodiment of the present invention, the first resistance part 210 is disposed between a first capacitance part 220 and the second capacitance part 240.

In the CR snubber element 200 according to the present embodiment, a first end of the first capacitance part 220 is connected to a circuit of an electronic component or the like disposed around the CR snubber element 200. Moreover, a first end of the first resistance part 210 is connected to a second end of the first capacitance part 220, and a first end of the second resistance part 230 is connected to a second end of the first resistance part 210.

In the present embodiment, the first capacitance part 220 is configured by the semiconductor substrate 212 facing the second external electrode 270 with the first dielectric layer 222 interposed therebetween, as shown in FIG. 5. Further, the second external electrode 270 is provided at one end of the first capacitance part 220.

As described above, in the CR snubber element 200 according to the second embodiment of the present invention, the first dielectric layer 222 and the like that configure the first capacitance part 220 are located on the side of the second main surface 216 of the semiconductor substrate 212, and the second dielectric layer 242 and the like that configure the second capacitance part 240 are located on the side of the first main surface 214 of the semiconductor substrate 212. That is, the semiconductor substrate 212 that configures the first resistance part 210 is disposed between the first capacitance part 220 and the second capacitance part 240. Thus, the semiconductor substrate 212 is configured to prevent heat generated when the first capacitance part 220 is short-circuited from being transmitted to the second capacitance part 240, and is configured to prevent the second capacitance part 240 from being damaged.

Embodiment 3

Figure 7:
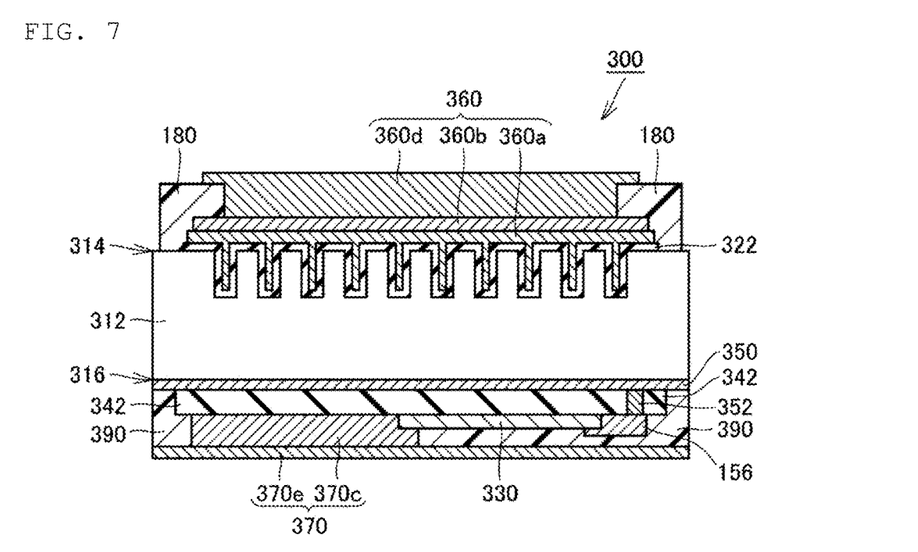
FIG. 7 is a sectional view showing a structure of a CR snubber element according to a third embodiment of the present invention.

Hereinafter, a CR snubber element according to a third embodiment of the present invention will be described. The CR snubber element according to the third embodiment is mainly different from the CR snubber element 100 according to the first embodiment in that the first resistance part is disposed between the first capacitance part and the second capacitance part. Thus, the description of a configuration similar to that of the CR snubber element 100 according to the first embodiment will not be repeated.

FIG. 7 is a sectional view showing a structure of the CR snubber element according to the third embodiment of the present invention. As shown in FIG. 7, in the CR snubber element 300 according to the third embodiment of the present invention, a first external electrode 360 is located on a side of a first dielectric layer 322 opposite to a semiconductor substrate 312. In the present embodiment, the first external electrode 360 is stacked on the first dielectric layer 322. When the CR snubber element 300 is viewed from a side of the first external electrode 360, an outer edge of the first external electrode 360 is located inside with respect to an outer edge of the first dielectric layer 322.

A contact area of the first external electrode 160 and the first dielectric layer 322 has a size such that the capacitance of the first capacitance part is at the above-mentioned value.

The first external electrode 360 has a comb-shaped electrode part 360a, a plate-shaped electrode part 360b, and a pad electrode part 360d. The comb-shaped electrode part 360a is stacked on the first dielectric layer 322 stacked in conformity with a plurality of recesses of a first main surface 314, such that it is extended therein the recesses. A surface of the comb-shaped electrode part 360a opposite to a side of the first dielectric layer 322 is a flat or planar surface, and the plate-shaped electrode part 360b is stacked on the flat surface of the comb-shaped electrode part 360a.

When the CR snubber element 300 is viewed from the side of the first external electrode 360, an outer edge of the plate-shaped electrode part 360b is located inside with respect to an outer edge of the comb-shaped electrode part 360a.

The pad electrode part 360d is stacked on the plate-shaped electrode part 360b. When the CR snubber element 300 is viewed from the side of the first external electrode 360, an outer edge of the pad electrode part 360d is located inside with respect to the outer edge of the plate-shaped electrode part 360b. The first external electrode 360 is exposed on the surface of the CR snubber element 100 at the pad electrode part 360d.

An internal electrode 350 is located on a side of a second main surface 316 of the semiconductor substrate 312. When the CR snubber element 300 is viewed from a side of a second external electrode 370, an external shape of the internal electrode 350 is substantially identical to an external shape of the semiconductor substrate 312. The internal electrode 350 is formed in a plate-like shape.

A second dielectric layer 342 is located on a side of the internal electrode 350 opposite to the semiconductor substrate 312. The second dielectric layer 342 is stacked on the internal electrode 350. When the snubber element 300 is viewed from the side of the second external electrode 370, an outer edge of the second dielectric layer 342 is located further inside with respect to an outer edge of the internal electrode 350.

The second external electrode 370 is located on a side of the second dielectric layer 342 opposite to the internal electrode 350. In the present embodiment, the second external electrode 370 has a counter electrode part 370c and a plate-shaped electrode part 370e. The second external electrode 370 is in contact with the second dielectric layer 342 at the counter electrode part 370c. Moreover, the second external electrode 370 is exposed outside the CR snubber element 300 at the plate-shaped electrode part 370e.

When the CR snubber element 300 is viewed from the side of the second external electrode 370, an outer edge of the counter electrode part 370c is located inside with respect to an outer edge of the second dielectric layer 342, and an outer edge of the plate-shaped electrode part 370e is substantially identical to the outer edge of the internal electrode 350.

In the present embodiment, a contact area of the second external electrode 370 and the second dielectric layer 342 is set such that the capacitance of the second capacitance part is at the above-mentioned value.

A connection conductive part 352 is disposed so as to penetrate the second dielectric layer 342. The connection conductive part 352 is disposed apart from the second external electrode 370 when the CR snubber element 300 is viewed from the side of the second external electrode 370.

A second resistance part 330 is located on a side of the second external electrode 370 of the second dielectric layer 342. The second resistance part 330 is connected to the second external electrode 370. In the present embodiment, the second resistance part 330 is directly connected to the counter electrode part 370c of the second external electrode 370. The second resistance part 330 is connected to the internal electrode 350 with the connection conductive part 352 interposed therebetween.

In the present embodiment, the CR snubber element 300 further includes a second protective layer 390 that is provided so as to fill a space formed between the second main surface 316 of the semiconductor substrate 312 and the plate-shaped electrode part 370e of the second external electrode 370.

Figure 8:
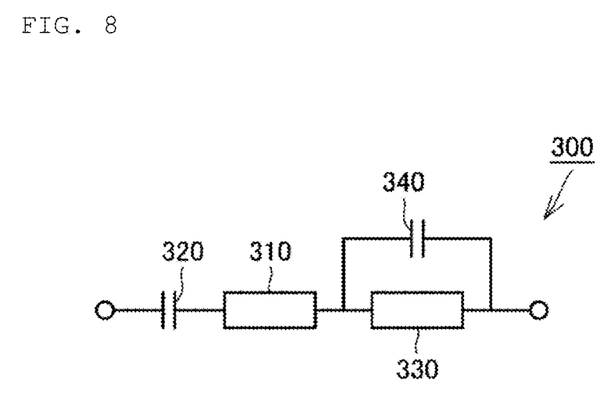
FIG. 8 is an equivalent circuit diagram of the CR snubber element of FIG. 7.

Next, a circuit configuration and operation of the CR snubber element 300 according to the third embodiment of the present invention will be described. FIG. 8 is an equivalent circuit diagram of the CR snubber element of FIG. 7. As shown in FIG. 8, in the snubber element 300 according to the third embodiment of the present invention, a first resistance part 310 is disposed between a first capacitance part 320 and a second capacitance part 340.

In the CR snubber element 300 according to the present embodiment, a first end of the second resistance part 330 is connected to a circuit such as an electronic component or the like disposed around the CR snubber element 300. The second end of the second resistance part 330 is connected to a first end of the first resistance part 310. As shown in FIG. 7, the second external electrode 370 is provided at the first end of the second resistance part 330.

In the present embodiment, the CR snubber element 300 according to the present embodiment has the second end of the first capacitance part 320 connected to a circuit of an electronic component or the like disposed around the CR snubber element 200.

In the present embodiment, the first capacitance part 320 is configured by the semiconductor substrate 312 facing the first external electrode 360 with the first dielectric layer 322 interposed therebetween, as shown in FIG. 7. The first external electrode 360 is provided at the other end of the first capacitance part 320.

In the present embodiment, the second capacitance part 340 is configured by the internal electrode 350 facing the second external electrode 370 with the second dielectric layer 342 interposed therebetween, as shown in FIG. 7.

As described above, in the CR snubber element 300 according to the third embodiment, the first dielectric layer 322 and the like that configure the first capacitance part 320 are located on the side of the first main surface 314 of the semiconductor substrate 312, and the second dielectric layer 342 and the like that configure the second capacitance part 340 are located on the side of the second main surface 316 of the semiconductor substrate 312. That is, the semiconductor substrate 312 that configures the first resistance part 310 is disposed between the first capacitance part 320 and the second capacitance part 340. Thus, the semiconductor substrate 312 is configured to prevent heat generated when the first capacitance part 320 is short-circuited from being transmitted to the second capacitance part 340, and is configured to prevent the second capacitance part 340 from being damaged.

In general, it is noted that in the above description of the exemplary embodiments, configurations that can be combined may be combined with each other.

Moreover, the exemplary embodiments disclosed herein are to be considered as illustrative in all points and not restrictive. It is also generally noted that the scope of the present invention is shown not by the above description but by the claims, and is intended to include meanings equivalent to the claims and all modifications within the claims.

DESCRIPTION OF REFERENCE SYMBOLS 100, 200, 300: CR snubber element
110, 210, 310: First resistance part
112, 212, 312: Semiconductor substrate
114, 214, 314: First main surface
116, 216, 316: Second main surface
120, 220, 320: First capacitance part
122, 222, 322: First dielectric layer
130, 230, 330: Second resistance part
140, 240, 340: Second capacitance part
142, 242, 342: Second dielectric layer
150, 250, 350: Internal electrode
150a, 270a, 360a: Comb-shaped electrode part
150b, 270b, 360b, 370e: Plate-shaped electrode part
152, 352: Connection conductive part
156: Connection electrode
160, 360: First external electrode
160c, 370c: Counter electrode part
160d, 360d: Pad electrode part
170, 270, 370: Second external electrode
180: First protective layer
290, 390: Second protective layer

The invention claimed is:

1. A CR snubber element comprising:
a first resistance part;
a first capacitance part connected in series to the first resistance part;
a second resistance part connected in series to the first resistance part and the first capacitance part; and
a second capacitance part connected in parallel to the second resistance part,
wherein the second resistance part is configured to be disconnected when the first capacitance part is short-circuited due to a surge voltage generated by an electronic component coupled to the CR snubber element.

2. The CR snubber element according to claim 1, wherein the second resistance part is configured by a thin film resistor.

3. The CR snubber element according to claim 1, wherein the second capacitance part comprises a capacitance substantially identical to a capacitance of the first capacitance part.

4. The CR snubber element according to claim 1, wherein the second resistance part comprises a resistance value that is smaller than a resistance value of the first resistance part.

5. The CR snubber element according to claim 1, wherein the second resistance part comprises a value of a fusing current that is smaller than a value of a fusing current of the first resistance part.

6. The CR snubber element according to claim 1, wherein the first resistance part is configured by a semiconductor substrate having a first main surface, and wherein the first capacitance part is configured by the semiconductor substrate facing an internal electrode that is disposed on a side of a first dielectric layer disposed on the first main surface of the semiconductor substrate.

7. The CR snubber element according to claim 6, wherein the second capacitance part is configured by the internal electrode facing an external electrode that is disposed on a side of a second dielectric layer opposite to the internal electrode and across the second dielectric layer that is disposed on a side of the internal electrode opposite to the first dielectric layer.

8. The CR snubber element according to claim 7, wherein the second resistance part is disposed on the second dielectric layer, is connected to the external electrode, and is connected to the internal electrode with a connection conductive part disposed to penetrate the second dielectric layer interposed between the second resistance part and the internal electrode.

9. The CR snubber element according to claim 1,
wherein the first resistance part is configured by a semiconductor substrate having a first main surface and a second main surface that opposes the first main surface, and
wherein the first capacitance part is configured by the semiconductor substrate facing a first external electrode located on a side of a first dielectric layer disposed on the second main surface of the semiconductor substrate.

10. The CR snubber element according to claim 9, wherein the second capacitance part is configured by an internal electrode that is disposed on the first main surface of the semiconductor substrate, with the internal electrode facing a second external electrode located on a side of a second dielectric layer opposite to the internal electrode across the second dielectric layer located on a side of the internal electrode opposite to the semiconductor substrate.

11. The CR snubber element according to claim 10, wherein the second resistance part is located on a side of the second external electrode of the second dielectric layer, is connected to the second external electrode, and is connected to the internal electrode with a connection conductive part disposed to penetrate the second dielectric layer interposed between the second resistance part and the internal electrode.

12. The CR snubber element according to claim 1,
wherein the first resistance part is configured by a semiconductor substrate having a first main surface and a second main surface that opposes the first main surface, and
wherein the first capacitance part is configured by the semiconductor substrate facing a first external electrode located on a side of a first dielectric layer disposed on the first main surface of the semiconductor substrate.

13. The CR snubber element according to claim 12, wherein the second capacitance part is configured by an internal electrode located on a side of the second main surface of the semiconductor substrate, with the internal electrode facing a second external electrode that is disposed on a side of a second dielectric layer disposed on the internal electrode opposite to the semiconductor substrate.

14. The CR snubber element according to claim 13, wherein the second resistance part is disposed on a side of the second external electrode of the second dielectric layer, is connected to the second external electrode, and is connected to the internal electrode with a connection conductive part disposed to penetrate the second dielectric layer interposed between the second resistance part and the internal electrode.

15. A CR snubber element comprising:
a semiconductor substrate having a first main surface that configures a first resistance part;
a first dielectric layer disposed on the first main surface of the semiconductor substrate with an internal electrode disposed thereon that configures a first capacitance part connected in series to the first resistance part; and
an external electrode that is disposed on a side of a second dielectric layer opposite to the internal electrode and across the second dielectric layer so as to configure a second capacitance part that is connected in parallel to a second resistance part that is connected in series to the first resistance part and the first capacitance part,
wherein the second resistance part is configured to disconnect when the first capacitance part is short-circuited.

16. The CR snubber element according to claim 15, wherein the second resistance part is disposed on the second dielectric layer, is connected to the external electrode, and is connected to the internal electrode with a connection conductor extending through the second dielectric layer that is interposed between the second resistance part and the internal electrode.

17. The CR snubber element according to claim 15, wherein the second resistance part is configured by a thin film resistor.

18. The CR snubber element according to claim 15, wherein the second capacitance part comprises a capacitance substantially identical to a capacitance of the first capacitance part.

19. The CR snubber element according to claim 15, wherein the second resistance part comprises a resistance value that is smaller than a resistance value of the first resistance part.

20. The CR snubber element according to claim 15, wherein the second resistance part comprises a value of a fusing current that is smaller than a value of a fusing current of the first resistance part.

* * * * *